(12) United States Patent
Xin et al.

(10) Patent No.: US 11,672,079 B2
(45) Date of Patent: Jun. 6, 2023

(54) COMPONENT CARRIER WITH IMPROVED BENDING PERFORMANCE

(71) Applicant: AT&S (China) Co. Ltd., Shanghai (CN)

(72) Inventors: Nick Xin, Shanghai (CN); Mikael Tuominen, Pernio (FI)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 17/444,364

(22) Filed: Aug. 3, 2021

(65) Prior Publication Data

US 2021/0368613 A1  Nov. 25, 2021

Related U.S. Application Data

(63) Continuation of application No. 16/564,331, filed on Sep. 9, 2019, now abandoned.

(30) Foreign Application Priority Data

Nov. 14, 2018  (CN) .......................... 201821878788.6

(51) Int. Cl.
| | |
|---|---|
| *H05K 1/02* | (2006.01) |
| *H05K 1/11* | (2006.01) |
| *H05K 1/03* | (2006.01) |
| *H05K 1/18* | (2006.01) |
| *H05K 1/14* | (2006.01) |

(52) U.S. Cl.
CPC ........... *H05K 1/028* (2013.01); *H05K 1/0298* (2013.01); *H05K 1/0393* (2013.01); *H05K 1/181* (2013.01); *H05K 1/0277* (2013.01); *H05K 1/0278* (2013.01); *H05K 1/0283* (2013.01); *H05K 1/038* (2013.01); *H05K 1/118* (2013.01); *H05K 1/148* (2013.01); *H05K 2201/046* (2013.01); *H05K 2201/05* (2013.01); *H05K 2201/055* (2013.01);

(Continued)

(58) Field of Classification Search
CPC .... H05K 1/028; H05K 1/0298; H05K 1/0393; H05K 1/181; H05K 1/0277; H05K 1/0278; H05K 1/0283; H05K 1/038; H05K 1/118; H05K 1/148; H05K 2201/046; H05K 2201/05; H05K 2201/055; H05K 2201/056; H05K 2201/058

See application file for complete search history.

(56) References Cited

U.S. PATENT DOCUMENTS 8,624,130 B2   1/2014  Bagung
9,860,978 B1 *  1/2018  Liu ..................... H05K 1/0277

(Continued)

FOREIGN PATENT DOCUMENTS

| CN | 102946688 A | 2/2013 |
|---|---|---|
| JP | 2012041574 A | 3/2012 |
| JP | 2015216210 A | 12/2015 |

*Primary Examiner* — Paresh Paghadal
(74) *Attorney, Agent, or Firm* — Robert A. Blaha; Smith Tempel Blaha LLC

(57) ABSTRACT

A component carrier, wherein the component carrier includes: i) a layer stack with at least one electrically conductive layer structure and/or at least one electrically insulating layer structure, ii) a bendable portion which forms at least a part of the layer stack, and iii) a metal layer which forms at least a part of the bendable portion. Hereby, the metal layer extends over at least 75% of the area of the bendable portion.

16 Claims, 3 Drawing Sheets

(52) U.S. Cl.
CPC . *H05K 2201/056* (2013.01); *H05K 2201/058* (2013.01)

(56) References Cited

U.S. PATENT DOCUMENTS

| | | | |
|---|---|---|---|
| 2007/0277998 A1* | 12/2007 | Suzuki | H05K 3/4691 174/255 |
| 2007/0281499 A1 | 12/2007 | Muro et al. | |
| 2008/0093110 A1 | 4/2008 | Bagung | |
| 2008/0225476 A1 | 9/2008 | Karabatsos | |
| 2008/0289859 A1* | 11/2008 | Mikado | H05K 3/4691 427/98.5 |
| 2009/0242243 A1 | 10/2009 | Bagung | |
| 2010/0170703 A1 | 7/2010 | Iihola et al. | |
| 2010/0193223 A1 | 8/2010 | Bagung et al. | |
| 2010/0270923 A1 | 10/2010 | Froehlich et al. | |
| 2010/0294544 A1 | 11/2010 | Momota et al. | |
| 2011/0114371 A1* | 5/2011 | Lin | B32B 7/12 174/254 |
| 2011/0284275 A1 | 11/2011 | Bagung | |
| 2012/0090881 A1 | 4/2012 | Sugiura et al. | |
| 2012/0097433 A1 | 4/2012 | Kato et al. | |
| 2013/0087375 A1 | 4/2013 | Tsunoi | |
| 2014/0182899 A1* | 7/2014 | Li | H05K 3/4691 156/92 |
| 2015/0257284 A1 | 9/2015 | Toda et al. | |
| 2015/0319844 A1* | 11/2015 | Kim | H05K 1/028 29/829 |
| 2015/0327355 A1 | 11/2015 | Wölfel | |
| 2015/0373829 A1* | 12/2015 | Ishikawa | H05K 1/0281 174/254 |
| 2016/0014903 A1* | 1/2016 | Kato | H05K 1/165 174/254 |
| 2016/0174304 A1* | 6/2016 | Kim | H05B 33/06 313/511 |
| 2017/0196077 A1* | 7/2017 | Iriguchi | H05K 1/185 |
| 2018/0168042 A1 | 6/2018 | Hartman | |
| 2019/0053369 A1 | 2/2019 | Harada | |
| 2019/0116664 A1 | 4/2019 | Krivec | |

* cited by examiner 5.8% strain at resin/ soldermask interface 3.7% strain at copper/ soldermask interface

COMPONENT CARRIER WITH IMPROVED BENDING PERFORMANCE

TECHNICAL FIELD

The invention relates to a component carrier. In particular the invention relates to a component carrier comprising a bendable portion. Furthermore, the invention relates to a method of manufacturing a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions. Furthermore, it is also desirable for specific requirements to provide component carriers which are semi-flexible or purely flexible. These at least partially bendable component carriers are suitable for a large variety of applications. For example, the need to provide additional cables could be overcome by implementing a flexible component carrier. Flexible component carriers may thus be used to replace wiring and connectors, allowing for connections and geometries that are not possible with rigid component carriers. However, there are still problems with flexible component carriers. In particular, providing a component carrier with a flexible portion, wherein the flexible portion is resistant against stress and strain, is still a challenge.

SUMMARY

There may be a need to provide a component carrier with an improved bending performance.

A component carrier and a method for manufacturing a component carrier according to the independent claim are provided.

According to an aspect of the invention, a component carrier is provided, wherein the component carrier comprises: i) a layer stack comprising at least one electrically conductive layer structure and/or at least one electrically insulating layer structure, ii) a bendable portion which forms at least a part of the layer stack, and iii) a metal layer which forms at least a part of the bendable portion. Hereby, the metal layer extends over at least 75% of the area of the bendable portion.

According to a further aspect of the invention, a method for manufacturing a component carrier is provided. The method comprises: i) forming a layer stack comprising at least one electrically conductive layer structure and/or at least one electrically insulating layer structure, ii) forming a bendable portion which forms at least a part of the layer stack, and iii) forming a metal layer as at least a part of the bendable portion such that the metal layer extends over at least 75% of the area of the bendable portion.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, a substrate-like-PCB (SLP), and an IC (integrated circuit) substrate. A component carrier may also be a hybrid board combining different ones of the above-mentioned types of component carriers. Furthermore, the component carrier may be a flexible component carrier, a semi-flexible component carrier, or a rigid-flex component carrier.

In the context of the present application, the term "bendable portion" may particularly denote any structure in a layer stack that is suitable to be bended. In other words, the term "bendable portion" may denote every portion of a component carrier that is flexible such that a bending of said portion is possible. For example, a component carrier may comprise a layer stack with e.g. ten layers. A recess may be formed into the layer stack (e.g. in the middle or center) in order to provide a recessed part. Said recessed part may comprise e.g. only four layers, thereby being much thinner than the non-recessed parts of the layer stack. Because the recessed portion is very thin, it is also flexible with respect to the non-recessed parts of the layer stack, which are thicker and therefore rigid. The properties of the recessed portion may also be influenced by the material that is used for building the layers of the bendable portion. The use of flexible material may further improve the bendability. The described bendable portion may connect two rigid, non-bendable portions of the layer stack such that the rigid, nonbendable portions can be moved with respect to each other, when the bending portion between them is bended.

In the context of the present application, the term "metal layer" may particularly denote any structure that consists of metal and is designed as a layer. For example, the metal layer may be formed as a foil, e.g. a copper foil. The layer may hereby be a continuous layer or a patterned layer. The layer may be designed as a thick copper layer, a so-called "full copper" layer. The metal layer may be formed together with the other layers of the layer stack in a build-up laminating process. Hereby, the metal layer may be formed by electroplating (galvanic plating) and/or electro-less plating. When the bending portion is viewed from a top view, i.e. from a viewing direction being perpendicular to the main extension directions of the component carrier (in other words: a viewing direction being parallel to a normal vector of a plane, which plane is parallel to the two main extension directions of the component carrier), then the metal layer covers at least 75% of the area of the bending portion. As a consequence, the metal layer may indeed be seen as a layer (continuous or patterned) and not as a metal trace. The thickness of the metal layer may be in the range 1 µm to 100 µm, in particular 12 µm to 36 µm.

According to an exemplary embodiment, the invention is based on the idea that, with the implementation of an additional metal layer within a bendable portion of a layer stack, the bending performance of a component carrier is highly improved and the formation of defects, such as cracks, is reduced (i.e. material stress reduction). Conventionally, a bendable portion within a component carrier is realized with a plurality of resin layers, especially the outermost layers of said bendable portion are resin layers (resin/solder mask interface). This design leads to a poor bending performance with a high strain (e.g. a deformation of 5.8%), in particular at a resin/solder mask interface, and crack formation. Hereby, it has to be taken into account that the maximum allowable strain deformation of resin is below 2%. It has now been surprisingly found that, by forming a metal layer which extends over at least 75% of the area of the bendable portion (thereby being formed as an at least partially continuous layer and not only as a metal trace), the bending performance is highly improved, while the formation of defects, such as cracks, is highly decreased. The bending behavior of the component carrier is thereby optimized and the formation of asymmetries during the bending can be avoided. Especially at a metal/solder mask interface, the strain deformation may be optimized (e.g. to 3.7% in the case of copper). In contrast to resin, the maximum allowable strain of metal is very large, e.g. larger than 10% in the case of copper. The bending radius, e.g. in a semi-flexible component carrier, may also be improved in this manner with a highly reliable capability. Furthermore, the described solution can be implemented into high volume production technologies in a straightforward manner. These technical effects are in particular surprising because metal, e.g. copper, is generally not considered as a flexible material.

In the following, further exemplary embodiments of the method and the component carrier will be explained.

According to an exemplary embodiment, the metal layer is a continuous layer that extends over the whole area of the bendable portion. This may provide the advantage that the bending performance of the component carrier is further improved. The implementation of at least one metal layer provides surprising advantages over the conventionally applied resin (see discussion above). When applying the metal layer to the whole area (when seen from a top view) of the bendable portion, the advantageous effects may also arise at the whole area of the bendable portion. Furthermore, a continuous portion is more robust than a patterned structure or traces. The metal layer may also extend further than the area of the bendable portion and may also extend over areas of non-bendable, rigid portions of the layer stack. A continuous metal layer could also be used as an electromagnetic radiation shielding structure in different applications.

According to a further exemplary embodiment, the metal layer is a patterned layer. This may provide the advantage that the metal layer can be used in a flexible manner for different advantageous applications. For example, a plurality of electric contacts may be realized, when a patterned metal layer is used. Several parts of the pattern may thereby be realized as connection pads or terminals. These pads/terminals could e.g. be contacted with interconnections such as vias. A via (vertical interconnection access) is an electrical connection between layers in a physical electronic circuit that goes through the plane of one or more adjacent layers. A complex and cost efficient circuitry may be provided in this manner. In another example, the metal layer could be patterned such that it can be used as an antenna structure.

According to a further exemplary embodiment, the metal layer is a metal foil, in particular a copper foil. This may provide the advantage that the metal layer can be manufactured in a straightforward and cost efficient manner using known and established processes. A metal foil can for example be manufactured with electroplating and/or electroless plating, in particular copper plating. This process step may be directly included into a production line. In this manner, the metal foil may be manufactured during a layer build-up, when the layer stack is produced.

According to a further exemplary embodiment, the metal layer is an outermost layer of the layer stack. This may provide the advantage that the bending performance of the component carrier is further improved. During bending of the bending portion, the stress and strain may be strongest at the outermost layer. When providing the metal layer with its advantageous effects at the position with the strongest stress and strain forces, these forces may be compensated in the best possible manner.

According to an exemplary embodiment, the metal layer is in direct contact with a solder mask, and the solder mask is an outermost layer of the layer stack. This may provide the advantage that the bending performance of the component carrier is further improved, while the metal layer is efficiently protected. A solder mask (or solder resist) may be a thin lacquer-like layer of polymer that is applied to the metal traces of a component carrier for protection against corrosion, oxidation, mechanical destruction, and to prevent solder bridges from forming between closely spaced solder pads. The solder mask thus protects the metal layer against corrosion, oxidation, mechanical destruction, and from solder bridges (in particular, when the metal layer is patterned into electric contacts). An interface between resin and solder mask is very prone to high stress and strain (see discussion above). In the case that a metal layer/solder mask interface is provided, the stress and strain (and hence also the crack formation) is reduced, and a highly improved bending performance may be achieved, also when providing an additional solder mask layer. The solder mask may comprise epoxy resin, for example epoxy acrylate.

According to a further exemplary embodiment, the metal layer is configured as an antenna structure. This may provide the advantage that the metal layer can be used in a flexible manner for specific functions. Besides its advantageous effects with respect to the bending behavior of the component carrier, the metal layer may additionally be used to fulfill a variety of technical functions. One of these functions may be an antenna function. There are many ways of how the metal layer could be patterned in order to receive an antenna structure.

The term "antenna structure" may particularly denote an arrangement of metallic conductor elements electrically connected for instance through a transmission line to a receiver or transmitter. Hence, an antenna structure may be denoted as an electrical member which converts electric power into radio waves, and/or vice versa. An antenna structure may be used with a controller (for instance a control chip) such as a radio transmitter and/or radio receiver. In transmission, a radio transmitter may supply an electric current oscillating at radio frequency (i.e. a high frequency alternating current) to the antenna structure's terminals, and the antenna structure may radiate the energy from the current as electromagnetic waves (in particular radio waves). In a reception mode, an antenna structure may intercept some of the power of an electromagnetic wave in order to produce a tiny voltage at its terminals, that may be applied for example to a receiver to be amplified. In embodiments, the antenna structure may be configured as a receiver antenna structure, a transmitter antenna structure, or as a transceiver (i.e. transmitter and receiver) antenna structure. In an embodiment, the antenna structure may be used for a radar application. The antenna structure may, for example, comprise a dipole antenna, a folded dipole antenna, a ring antenna, a rectangular loop antenna, a patch antenna, or a coplanar antenna. The antenna structure may also comprise a Yagi antenna or a fractal antenna. A Yagi antenna may be a multi-beam directional antenna for so-called mm wave applications. A fractal antenna may be another type of antenna that uses a self-similar design to maximize the length of a material in a total surface area. A fractal antenna may be compact and wideband and can act as an antenna for many different frequencies.

According to a further exemplary embodiment, the metal layer is configured for carrying an electric signal, in particular during operation of the component carrier. This may provide the advantage, that the metal layer, besides its advantageous effects with respect to the bending performance, also provides electrical functionalities. The metal layer may for example be at least partially patterned such that electric signals could be carried through different traces of the metal layer. Furthermore, the metal layer may comprise pads/terminals which could be connected to other conductor traces and/or vias. In the case that the metal layer is a continuous layer, the whole layer could function as one electric signal carrier. When the component carrier is in operation, the bendable portion, in particular the metal foil, may not only allow for connections and geometries that are not possible with rigid component carriers, but additional wirings and connectors may also be further reduced as they can be implemented in a straightforward manner into the metal layer.

According to a further exemplary embodiment, the metal layer has a tensile strength of at least 170 MPa. In particular, the tensile strength is at least 200 MPa. This may provide the advantage that the metal layer is especially robust against stress and strain. The (ultimate) tensile strength may be the capacity of a material or structure to withstand loads tending to elongate, i.e. the property to resist a tension force before breaking. While resin generally has a tensile strength around 50 MPa, copper has for example a tensile strength of around 210 MPa. As a consequence, metal (e.g. copper) is very suitable to withstand stress and strain under bending conditions.

According to a further exemplary embodiment, the component carrier is configured as a purely flexible component carrier or as a semiflexible component carrier. This may provide the advantage that the favorable bending properties of the described bending portion can be transferred directly to the component carrier in a straightforward manner. The difference between purely flexible and semi-flexible component carriers may be seen in that semi-flexible component carriers may be more limited in their bending radius than flexible component carriers. The bending radius of a semi-flexible component carrier may for example be smaller than 5 mm, in particular 3 mm. The use of a standard thin laminate may provide semiflexible component carriers as an especially cost-effective alternative. A so called "rigid-flex" component carrier may furthermore combine the advantages of flexible and rigid printed circuit boards, by yielding benefits for signal transmission, size and stability.

According to a further exemplary embodiment, the layer stack comprises a recessed portion, and the bendable portion is formed at the recessed portion. This may provide the advantage that the bendable portion can be manufactured in an easy and cost-efficient manner. In an embodiment, a layer stack may be manufactured, for example with ten layers. Then, a recessed portion may be provided by forming a cavity, for example by laser drilling, sand-blasting, photolithography, etching, or a combination thereof. After forming the cavity, the layer stack at the recessed portion may comprise less layers than non-recessed portions (e.g. only four). Due to the reduced number of layers, the recessed portion may be more flexible than the non-recessed portions. Therefore, the recessed portion may form the bendable portion. However, there are also other possibilities to provide a recessed portion. For example, there may be more layers laminated on the non-recessed portions positions than on the recessed portion position. In another embodiment, the non-recessed portions and the recessed portion may be manufactured separately and are then attached to each other in a later process step.

According to a further exemplary embodiment, a non-recessed portion of the layer stack is formed as a rigid portion which is not bendable. This may also provide the advantage that the bendable portion can be manufactured in an easy and cost-efficient manner. The rigid portion(s) may be manufactured as described above.

According to a further exemplary embodiment, the bendable portion is formed between a first rigid portion and a second rigid portion. This may provide the advantage that the component carrier is at the same time very flexible and still robust. In the final component carrier, the rigid portions may then be moved relative to each other, when bending the flexible, recessed portion arranged between them.

According to a further exemplary embodiment, the bottom of the bendable portion is flush with the bottom of the first rigid portion and the bottom of the second rigid portion. This may provide the advantage that the component carrier may be provided with a robust and practicable design which can be manufactured in a straightforward manner.

According to a further exemplary embodiment, the metal layer is formed at the bottom of the bendable portion, and the metal layer is not flush with the bottom the first rigid portion and the bottom of the second rigid portion. This may provide the advantage that the bending performance is further improved. In an embodiment, the bendable portion may be flush with the bottoms of the rigid portions. The metal layer, however, may be configured as an additional layer which is arranged below the other layer(s) of the bendable portion. In this embodiment, specific effects with respect to the bending performance and/or stability may be achieved.

According to a further exemplary embodiment the recessed portion is formed in a viewing direction being parallel to the main directions of extension of the component carrier, and/or the recessed portion is formed in a viewing direction being perpendicular to the main directions of extension of the component carrier. This may provide the advantage that the bending portion can be provided in a flexible manner, wherein the size and position of the bendable portion can be adjusted to different requirements. For example, when the bendable portion is meant to be very bendable and/or manufactured very cost-efficiently, a very large recess may be chosen. In another example, wherein the bendable portion is meant to be not very bendable, the bendable portion may be designed by providing a very small recess. In one embodiment, the recessed portion is formed only in one direction, and in another embodiment, the recessed portion is formed in two directions. For example, in a top view, in which the area of the bendable portion is completely visible, one recessed portion may be formed above the bendable portion (and between the first rigid portion and the second rigid portion) and another recessed portion may be formed below the bendable portion (and between the first rigid portion and the second rigid portion) such that the bendable portion is at least partially at a center position between the rigid portions. In another embodiment, in a cross-sectional view, in which the area of the bendable portion is not completely visible, one recessed portion may be formed above the bendable portion (and between the first rigid portion and the second rigid portion) and another recessed portion may be formed below the bendable portion (and between the first rigid portion and the second rigid portion) such that the bendable portion is at least partially at a center position between the rigid portions. These described embodiments could also be combined together.

According to a further exemplary embodiment, at least one layer of the layer stack extends from the first rigid portion through the bendable portion to the second rigid portion. This may provide the advantage that a robust component carrier can be provided by using a straightforward manufacturing process. In this manner, at least the layers shared by the rigid and the bendable portions may be manufactured in one and the same process steps. By providing continuous layers that extend through the rigid and the bendable portions, the structure of the component carrier may be very robust.

According to a further exemplary embodiment, the rigid portions are connected to the bendable portion via a rigid connection. This may provide the advantage that the component carrier can be assembled in a flexible manner. According to an embodiment, the rigid portions and the bendable portions may be manufactured separately and are assembled later. In this case, the different portions can be attached to each other individually with respect to the requirements of the final component carrier.

According to a further embodiment, the bending portion comprises a further metal layer, and at least one electrically insulating layer structure arranged between the metal layer and the further metal layer. In this embodiment, an electrically insulating layer structure of the layer stack may extend through the bendable portion. Furthermore, also the metal layer and/or the further metal layer may extend through the layer stack.

In an embodiment, an electronic component may be embedded in the component carrier. The electronic component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), a die, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, a logic chip, a light guide, and an energy harvesting unit. However, other components may be embedded in or surface mounted on the component carrier. For example, a magnetic element can be used as a component. Such a magnetic element may be a permanent magnetic element (such as a ferromagnetic element, an antiferromagnetic element or a ferromagnetic element, for instance a ferrite coupling structure) or may be a paramagnetic element. However, the component may also be a substrate, an interposer or a further component carrier, for example in a board-in-board configuration. Moreover, also other components, in particular those which generate and emit electromagnetic radiation and/or are sensitive with regard to electromagnetic radiation propagating from an environment, may be used as component.

In an embodiment, the at least one electrically insulating layer structure comprises at least one of the group consisting of resin (such as reinforced or non-reinforced resins, for instance epoxy resin or Bismaleimide-Triazine resin, cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates for substrates may be used as well. For high frequency applications, high frequency materials such as polytetrafluoroethylene, liquid crystal polymer and/or cyanate ester resins, low temperature cofired ceramics (LTCC) or other low, very low or ultra low DK-materials may be implemented in the component carrier as electrically insulating layer structure.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing particles (such as reinforcing spheres, in particular glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres). Furthermore, the component carrier may be configured as a substrate-like printed circuit board (SLP).

The substrate or interposer may consist of at least a layer of glass, Silicon (Si) or a photo-imageable or dry-etchable organic material like epoxy-based Build-Up films or polymer compounds like Polyimide, Polybenzoxazole, or Benzocyclobutene.

In an embodiment, the at least one electrically conductive layer structure and/or the electrically conductive structure comprises at least one of the group consisting of copper, aluminum, nickel, silver, gold, palladium, cobalt, and tungsten. Although copper is usually preferred, other materials or coated versions thereof are possible as well.

DETAILED DESCRIPTION OF ILLUSTRATED EMBODIMENTS

Figure 1:
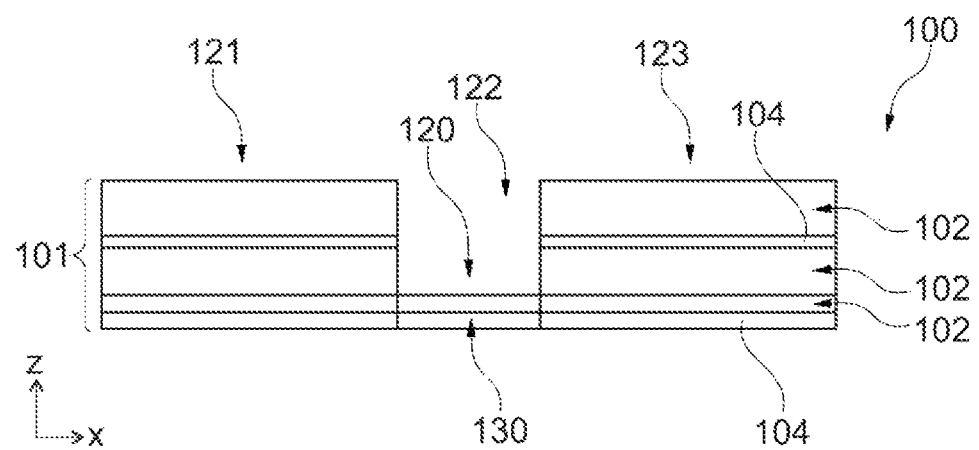
FIG. 1 illustrates a cross-sectional view of a component carrier according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

FIG. 1 illustrates a cross-sectional view (along the Y-axis, see axis indicated in the Figure) of a component carrier 100 according to an exemplary embodiment. The component carrier 100 comprises a layer stack 101 having electrically conductive layer structures 104 and electrically insulating layer structures 102. Furthermore, the component carrier 100 comprises a bendable portion 120 which forms at least a part of the layer stack 101. The layer stack 101 comprises hereby a recessed portion 122, and the bendable portion 120 is formed at the recessed portion 122. Nonrecessed portions 121, 123 of the layer stack 101 are formed as a first rigid portion 121 and a second rigid portion 123 which are not bendable. The bendable portion 120 is formed between the two rigid portions 121, 123, and the bottom of the bendable portion 120 is flush with the bottoms of the rigid portions 121, 123 which are arranged next to the bendable portion 120. The recessed portion 122 is formed in a viewing direction being parallel to one of the main directions of extension of the component carrier 100. In other words, the recessed portion 122 is formed along the indicated Z-axis. The main directions of extension of the component carrier are hereby along the X and Y axis. Two layers 102, 104 of the layer stack 101 extend from the first rigid portion 121 through the bendable portion 120 to the second rigid portion 123. Hereby, a metal layer 130 forms a part of the bendable portion 120 and of the layer stack 101. The metal layer 130 is a continuous layer and covers the whole area of the bendable portion 120 and is a configured as a copper foil. The area of the bendable portion 120 is along the main directions of extension of the component carrier 100 and the layer stack 101, which extend along the X- and the Y-axis. In this exemplary embodiment, the metal layer 130 extends from the first rigid portion 121 through the bendable portion 120 to the second rigid portion 123.

Figure 2:
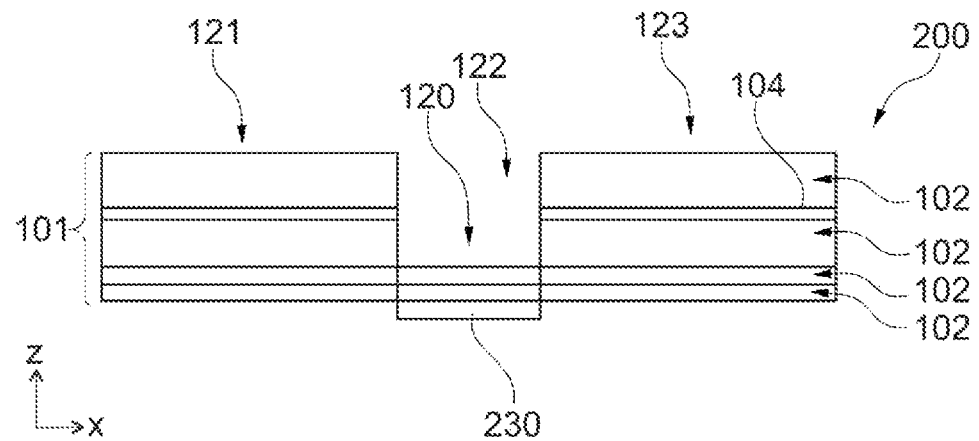
FIG. 2 illustrates a cross-sectional view of a component carrier according to a further exemplary embodiment of the invention.

FIG. 2 illustrates a cross-sectional view (along the Y-axis) of a component carrier 200 according to a further exemplary embodiment. The component carrier 200 according to FIG. 2 is very similar to the component carrier 100 of FIG. 1, however, the metal layer 230 is formed at the bottom of the bendable portion 120, and the metal layer 230 is not flush with the bottom of the neighboring rigid portions 121, 123. The bendable portion 120, without the metal layer 230, is flush with the bottoms of the rigid portions 121, 123. The metal layer 230 is configured as an additional layer which is arranged below the other layers of the bendable portion 120.

Figure 3:
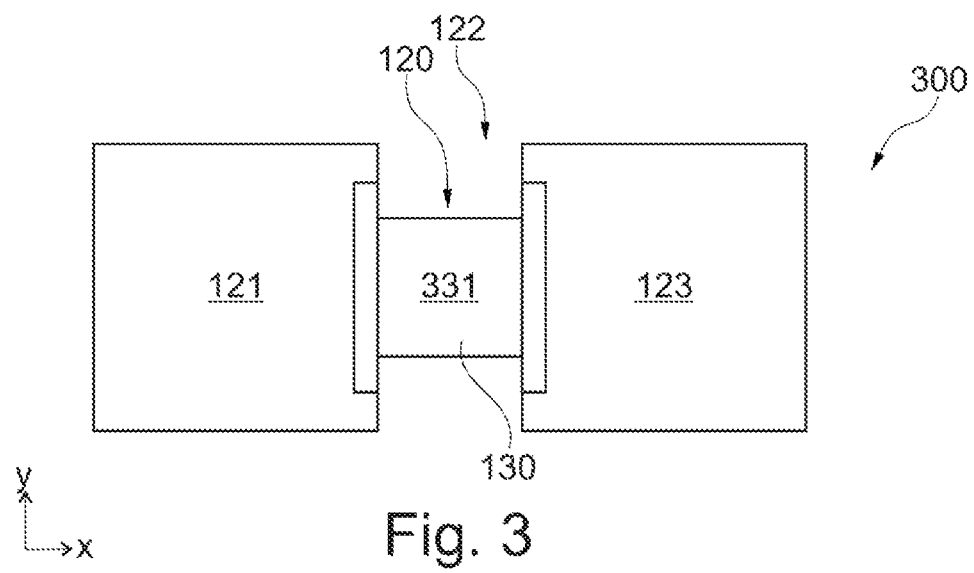
FIG. 3 illustrates a top view of a component carrier according to a further exemplary embodiment of the invention.

FIG. 3 illustrates a top view (along the Z-axis) of a further exemplary embodiment of a component carrier 300. The component carrier 300 according to FIG. 3 is very similar to the component carrier 100 of FIG. 1, however, the recessed portion 122 is formed in a viewing direction being parallel to one of the main directions of extension of the component carrier 100 and the recessed portion 122 is formed in a viewing direction being perpendicular to the main directions of extension of the component carrier 100. In other words, the recessed portion is formed in the direction along the indicated Z-axis of FIG. 1 and in the direction along the indicated Y-axis of FIG. 3. In this example, the bendable portion 120 is arranged at a center position between the rigid portions 121, 123. It can be seen in the FIG. 3, that the metal layer 130 is not restricted to the bendable portion 120 but extends also into the rigid portions 121, 123 of the layer stack 101, which rigid portions 121, 123 are arranged next to the bendable portion 120. The area 331 of the bendable portion 120 is along the main directions of extension of the component carrier 100 and the layer stack 101, which extend along the X- and the Y-axis.

Figure 4:
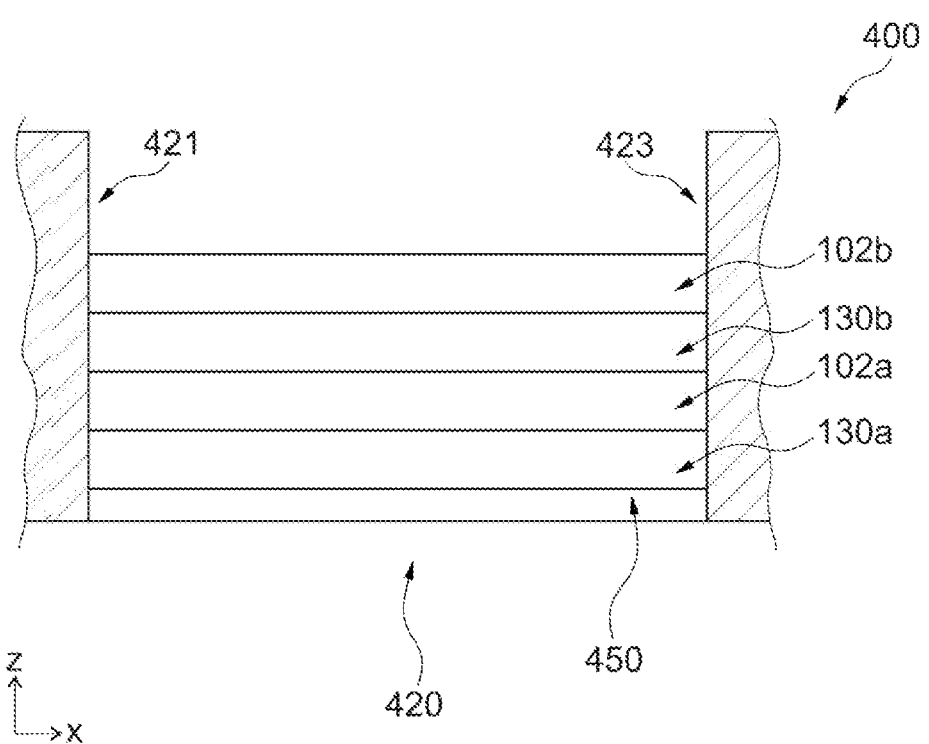
FIG. 4 illustrates a cross-sectional view of a component carrier according to a further exemplary embodiment of the invention.

FIG. 4 illustrates a cross-sectional view of the bendable portion 420 of a component carrier 400 according to an exemplary embodiment. The bendable portion 420 is build-up of the following layer stack from bottom to top: i) a solder mask 450, e.g. made of epoxy acrylate, which forms the outermost layer of the bendable portion 420, ii) a first metal layer 130a, e.g. a copper foil, being arranged directly in contact with the solder mask 450, iii) a first electrically insulating layer structure 102a, e.g. made of prepreg, iv) a second (further) metal layer 130b, and v) a second electrically insulating layer structure 102b, e.g. also made of prepreg. In this exemplary embodiment, the bendable portion 420 and the rigid portions 421, 423 are connected via a rigid connection. The layers of the bendable portion 420 are only present in said bendable portion 420 and do not extend through the rigid portions 421, 423. The height of the rigid portion 421, 423 is for example around 1.6 mm.

Figure 5A:
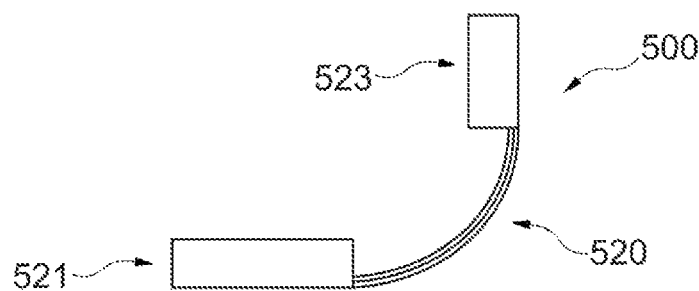
FIG. 5a, FIG. 5b and FIG. 5c illustrate experimental data with respect to the strain occurring at a bendable portion of a prior art example and of a component carrier according to an exemplary embodiment of the invention.
Figure 5B:
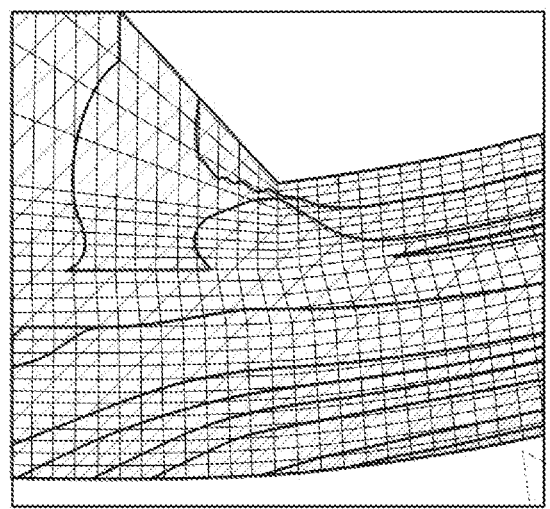
Figure 5C:
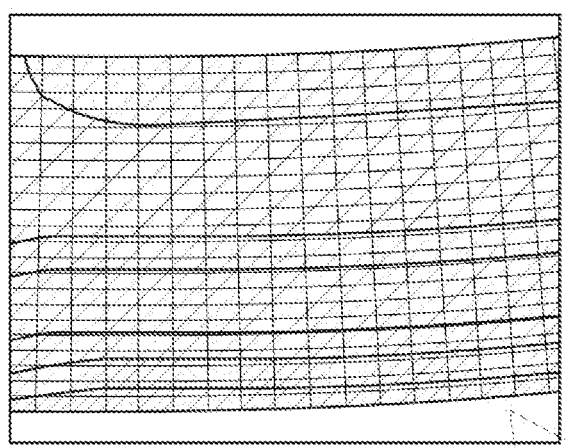

FIGS. 5a to 5c illustrate experimental data with respect to the strain occurring at the bendable portion of a prior art example and of a component carrier according to an exemplary embodiment of the invention.

FIG. 5a: a component carrier 500 comprises two rigid portions 521, 523 which are flexibly connected to each other via a bendable portion 520. The indicated square shows a region of interest, which is further shown in detail in FIGS. 5b and 5c, at an interface between the first rigid portion 521 and the bendable portion 520. The rigid portions 521, 523 are hereby shifted 90° with respect to each other such that a large strain occurs at the bending portion 520. Strain is hereby a measure of deformation representing the displacement between particles in the body relative to a reference length. The result is hereby given in percent.

FIG. 5b: in this example from the prior art, the outermost layer of the bendable portion is made of a resin layer covered with a solder mask. When investigating the strain, it can be seen that, at the resin/solder mask interface, there occurs a strain of 5.8%. This is highly critical, because the strain in a resin layer should not be more than 2%. Thus, the failure rate (e.g. formation of cracks) is significantly high in this case. Hereby, the reserve factor (factor of safety, defined by the failure load divided by the effective load) is <1).

FIG. 5c: in this exemplary embodiment of the invention, the outermost layer of the bendable portion 520 is a metal layer (full copper) covered with a solder mask. When investigating the strain, it can be seen that, at the copper/solder mask interface, there occurs a strain of 3.7%. This is not at all critical, because the strain in a copper layer could even be larger than 10%. Thus, the failure rate is significantly lower in this case (reserve factor >2).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

| Reference signs | |
| --- | --- |
| 100, 200, 300, 400, 500 | Component carrier |
| 101 | Layer stack |
| 102, 102a, 102b | Electrically insulating layer structure |
| 104 | Electrically conductive layer structure |
| 120, 420, 520 | Bendable portion |
| 121, 421, 521 | First rigid (non-recessed) portion |
| 122 | Recessed portion |
| 123, 423, 523 | Second rigid (non-recessed) portion |
| 130, 130a, 230 | Metal layer |
| 130b | Further metal layer |
| 331 | Area of the bendable portion |
| 450 | Solder mask |

The invention claimed is:

1. A component carrier, comprising:
   a layer stack comprising at least one electrically conductive layer structure and/or at least one electrically insulating layer structure;
   a bendable portion which forms at least a part of the layer stack and which comprises at least two bendable layers,
   wherein the layer stack comprises a recessed portion,
   wherein the bendable portion is formed at the recessed portion,
   wherein at least one non-recessed portion of the layer stack is formed as a rigid portion which is not bendable;
   a metal layer which forms at least a part of the bendable portion;
   wherein in a top view the metal layer extends over at least 75% of the area of the bendable portion; and
   a solder mask,
   wherein the metal layer is in direct contact with the solder mask, and
   wherein the solder mask is the outermost layer of the bendable portion,
   wherein the component carrier is a semi-flexible component carrier, and
   wherein the bending radius of the bendable portion is 5 mm or smaller;
   wherein the bendable portion is formed between a first rigid portion and a second rigid portion,
   wherein the metal layer extends from the first rigid portion through the bendable portion to the second rigid portion,
   wherein a first portion of the metal layer extends partially into the first rigid portion, wherein a second portion of the metal layer extends partially into the second rigid portion,
   wherein a third portion of the metal layer is formed in the bendable portion,
   wherein a first direction is oriented from the first rigid portion via the bendable portion to the second rigid portion, when seen in a planar view, and
   wherein along a second direction, oriented perpendicular to the first direction, when seen in the planar view, the first portion and the second portion, respectively, comprises a larger extension than the third portion.

2. The component carrier according to claim 1, wherein the metal layer is a continuous layer that extends over the whole area of the bendable portion.

3. The component carrier according to claim 1, wherein the metal layer is a patterned layer.

4. The component carrier according to claim 1, wherein the metal layer is a metal foil.

5. The component carrier according to claim 1, wherein the solder mask is flush with a main surface of the component carrier.

6. The component carrier according to claim 1, further comprising:
   an electrically insulating layer structure, which forms at least part of the bendable portion, arranged on the metal layer.

7. The component carrier according to claim 6, further comprising:
   a further metal layer, which forms at least part of the bendable portion, arranged on the electrically insulating layer structure.

8. The component carrier according to claim 7, wherein the electrically insulating layer structure is sandwiched between the metal layer and the further metal layer.

9. The component carrier according to claim 6, wherein the electrically insulating layer structure comprises a prepreg.

10. The component carrier according to claim 1, wherein the metal layer comprises at least one of the following features:
the metal layer is configured as an antenna structure;
the metal layer is configured for carrying an electric signal during operation of the component carrier;
the metal layer has a tensile strength of at least 170 MPa.

11. The component carrier according to claim 1, wherein the layers of the bendable portion are only present in the bendable portion and do not extend through the rigid portions.

12. The component carrier according to claim 1,
wherein the recessed portion is formed in a viewing direction being parallel to the main directions of extension of the component carrier, and/or
wherein the recessed portion is formed in a viewing direction being perpendicular to the main directions of extension of the component carrier.

13. The component carrier according to claim 1, wherein a bottom of the bendable portion is flush with a bottom of the first rigid portion and a bottom of the second rigid portion.

14. The component carrier according to claim 1, wherein the solder mask comprises epoxy acrylate.

15. A method for manufacturing a component carrier, the method comprising:
forming a layer stack comprising at least one electrically conductive layer structure and/or at least one electrically insulating layer structure;
forming a bendable portion which forms at least a part of the layer stack, which comprises at least two bendable layers,
wherein the layer stack comprises a recessed portion,
wherein the bendable portion is formed at the recessed portion,
wherein at least one non-recessed portion of the layer stack is formed as a rigid portion which is not bendable;
forming a metal layer as at least a part of the bendable portion, wherein in a top view the metal layer extends over at least 75% of the area of the bendable portion; and
forming a solder mask,
wherein the metal layer is in direct contact with the solder mask,
wherein the solder mask is the outermost layer of the bendable portion,
wherein the component carrier is a semi-flexible component carrier, and
wherein the bending radius of the bendable portion is 5 mm or smaller,
wherein the bendable portion is formed between a first rigid portion and a second rigid portion,
wherein the metal layer extends from the first rigid portion through the bendable portion to the second rigid portion,
wherein a first portion of the metal layer extends partially into the first rigid portion,
wherein a second portion of the metal layer extends partially into the second rigid portion,
wherein a third portion of the metal layer is formed in the bendable portion,
wherein a first direction is oriented from the first rigid portion via the bendable portion to the second rigid portion, when seen in a planar view, and
wherein along a second direction, oriented perpendicular to the first direction, when seen in the planar view, the first portion and the second portion, respectively, comprises a larger extension than the third portion.

16. The component carrier according to claim 1, wherein along the first direction, the third portion comprises a larger extension than the first portion and the second portion, respectively.

* * * * *